United States Patent [19]
Nobukata

[11] Patent Number: 5,909,395
[45] Date of Patent: Jun. 1, 1999

[54] FLASH EEPROM WITH ERASE VERIFICATION AND ADDRESS SCRAMBLING ARCHITECTURE

[75] Inventor: Hiromi Nobukata, Kanagawa, Japan

[73] Assignee: Sony Corporation, Tokyo, Japan

[21] Appl. No.: 08/708,557

[22] Filed: Sep. 6, 1996

Related U.S. Application Data

[62] Division of application No. 08/603,381, Feb. 20, 1996, abandoned, which is a continuation of application No. 08/089,555, Jul. 12, 1993, abandoned.

[30] Foreign Application Priority Data

Jul. 10, 1992 [JP] Japan ............................ P 4-207173
Sep. 4, 1992 [JP] Japan ............................ P 4-263017

[51] Int. Cl.$^6$ ............................................. G11C 16/04
[52] U.S. Cl. .............................. 365/185.22; 365/185.09
[58] Field of Search ................... 365/185.06, 185.09, 365/185.22

[56] References Cited

U.S. PATENT DOCUMENTS

| | | | |
|---|---|---|---|
| 5,297,103 | 3/1994 | Higuchi | 365/185.09 |
| 5,359,569 | 10/1994 | Fujita et al. | 365/185.09 |
| 5,359,570 | 10/1994 | Hsu et al. | 365/185.09 |
| 5,367,484 | 11/1994 | Alexander et al. | 365/185.09 |
| 5,388,083 | 2/1995 | Assar et al. | 365/185.09 |
| 5,390,148 | 2/1995 | Saito | 365/185.09 |
| 5,418,752 | 5/1995 | Harari et al. | 365/185.09 |
| 5,524,231 | 6/1996 | Brown | 365/185.09 |

*Primary Examiner*—A. Zarabian
*Attorney, Agent, or Firm*—Hill & Simpson

[57] ABSTRACT

In a flash EEPROM where erasing and verifying operations are repeated until the threshold voltages of memory cells reach a predetermined value, a negative voltage is applied, at the time of verification, to the control gate electrode of each cell on a nonselected row, so that the verification is rendered possible despite the existence of any overerased memory cell in the nonselected area, and then the overerased cell is rewritten to be released from the overerased state, whereby the threshold voltage distribution of the memory cells is settable in a narrow range. And by the provision of a means for converting an external designated address to an internal chip address, the storage area designated by the external address is shifted or circulated in the chip every time the data is erased, so that the number of repeatable reprogramming actions is increased apparently in the flash EEPROM.

3 Claims, 12 Drawing Sheets

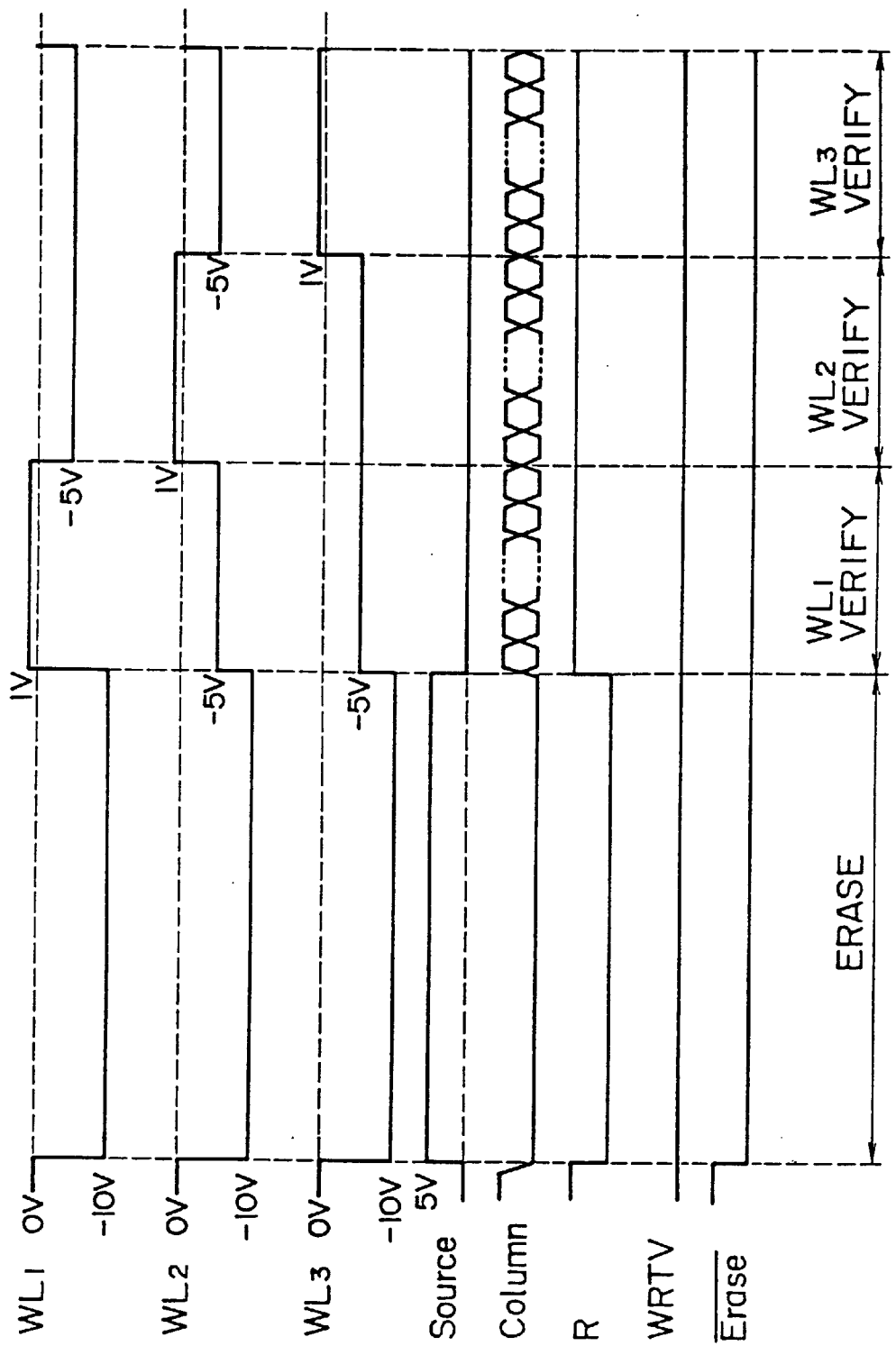

FLASH EEPROM WITH ERASE VERIFICATION AND ADDRESS SCRAMBLING ARCHITECTURE

This is a division of application Ser. No. 08/603,381, filed Feb. 20, 1996, now abandoned, which is a Continuation of Ser. No. 08/089,555 filed Jul. 12, 1993 now abandoned.

BACKGROUND OF THE INVENTION

1. Field of the Invention

The present invention relates to a method of erasing a flash EPROM or EEPROM (electrically erasable programmable read-only memory) and, more particularly, to an erasing method which repeats erase and verification after executing a pre-erase dummy writing operation with respect to entire memory cells to be erased. The invention further relates to the structure of a memory and a reprogramming method thereof adapted for preventing deterioration of gate oxide films that may be derived from repeated reprogramming actions.

2. Description of the Related Art

In flash EEPROMs, there occurs a phenomenon that threshold voltages thereof are widely distributed after erasing in an ordinary batch erasing mode due to variations of the capacitive coupling ratio between sources and floating gates in individual cells, so that problems are raised as a result inclusive of overerase where the threshold voltage is rendered negative, and in some partial cells on the chip, the threshold voltage is increased in excess to consequently cause improper operation.

It is generally known that, particularly when any overerased cell is existent in the chip, such a condition causes a fatal defect on the entire operation of the device. More specifically, in reading one cell on a bit line where any overerased cell is existent, a current comes to flow via such overerased cell, so that the cell in its off-state (written state) is decided erroneously to be in an on-state.

In erasing a flash EEPROM, it has been customary heretofore to execute the procedure of first pre-erase writing (dummy writing "0") every memory cell in the sector to be erased, then erasing the cells little by little while repeating erasure and verification, and completing the erasing operation after the threshold voltage Vth is lowered below a predetermined decision value.

However, according to such conventional erasing method that erases the cells gradually while repeating erasure and verification, there occurs a fault that, due to some variations of the gate film thickness in the chip, the threshold value is rendered negative in any memory cell transistor having a great threshold shift derived from the erasing operation, whereby such cell is overerased. And in conformity with an increase of the frequency of reprogramming operations, the threshold voltage distribution is spread as shown in FIG. 1 to eventually increase the possibility of overerasing. If the threshold voltage for deciding the erase is set to be high in an attempt to avert such a problem of overerasing, the driving capability of the transistor is lowered to consequently prolong the data reading time, or the supply voltage fails to be sufficient for a normal operation at any level below the threshold voltage for deciding the erase, thereby inducing an impediment to the latest requirements for realizing a lower rated supply voltage.

Further considering a memory chip where data are reprogrammed so many times, it is prone to occur that the reprogramming is concentrated merely on a specific portion of the chip to consequently bring about fast fatigue of the tunnel insulating film of the relevant cell, so that the number of repeatable reprogramming actions in the chip is thereby determined. For example, in a silicon disk used for replacement of a hard disk, data is generally stored in each of individual sectors as a unit, and coupling data between the adjacent sectors is written in a specific area termed FAT (file allocation table). Since the content of such FAT needs to be reprogrammed every time data is written in any of the areas on the silicon disk, the FAT is subjected to the greatest electric stress derived from the reprogramming action, whereby its gate insulating film is deteriorated in the earliest stage. Thus, the service life of the silicon disk relative to reprogramming is determined virtually by the reprogramming life of the FAT.

SUMMARY OF THE INVENTION

It is a first object of the present invention to provide a flash EEPROM erasing method which is free from causing any overerased state despite an increase of the reprogramming frequency as well as in an initial state and is advantageous for realizing a lower rated supply voltage and a faster operation.

And a second object of the present invention resides in providing an improved flash EEPROM wherein the probability of writing the same data in the same address is lowered to thereby suppress deterioration of a tunnel insulating film and, particularly in the use where data is reprogrammed frequently in a specific area alone, the number of repeatable reprogramming actions can be apparently increased.

For the purpose of achieving the objects mentioned, an improvement is contrived in the flash EEPROM erasing method of the present invention which executes pre-erase dummy writing in entire cells to be erased and then repeats erase and verification until the threshold voltages thereof are lowered below a predetermined decision level. According to this method, a negative voltage is applied to the control gate of each memory cell on a nonselected row at the time of verification.

Due to such application of a negative voltage to the control gate of each memory cell on a nonselected row at the time of verification, no current is caused to flow in an overerased cell, so that proper verification can be performed despite the existence of any overerased cell. Consequently, an overerased state that may be induced in an erasing mode raises no fatal problem, whereby it is rendered possible to set the erase decision level to a value lower than the conventional one and to widen the duration of an erasing pulse, which is to be applied to the drain, in comparison with the known pulse duration.

In addition, the distribution of the threshold voltages Vth can be set within a narrow range proximate to the lower potential side by first confirming that the threshold voltages Vth of the entire cells have been lowered below the erase decision level, and then reprogramming and verifying any overerased cell on each word line until the threshold voltage Vth thereof is raised beyond 0V.

Furthermore, there is provided an address converter which shifts an externally designated address at the time of every data erasing operation and supplies the corresponding memory chip address to a decoder. In another structure of a flash EEPROM having an area where data is frequently reprogrammed, there is provided an address converter for shifting, in each collective erasing operation, an externally designated address between such specific area and a spare area prepared in the same memory.

Thus, in the collective batch erasing mode, the externally designated address is shifted and supplied to the decoder, whereby the frequency of data reprogramming actions in the same address can be diminished to consequently suppress deterioration of the tunnel insulating film of the memory cell that is derived from the data reprogramming action.

Besides the above, in the EEPROM having a specific area where data reprogramming is executed frequently, the memory area to be accessed is switched by shifting the address between the specific area and the spare area in each erasing operation, so that it becomes possible to apparently increase the number of repeatable reprogramming actions in the specific area.

The above and other features and advantages of the present invention will become apparent from the following description which will be given with reference to the illustrative accompanying drawings.

BRIEF DESCRIPTION OF THE DRAWINGS

FIG. 5 is a timing chart of signals relative to an erasing cycle in the invention;

DESCRIPTION OF THE PREFERRED EMBODIMENTS

Hereinafter a first embodiment of the present invention will be described in detail with reference to the accompanying drawings.

Figure 2:
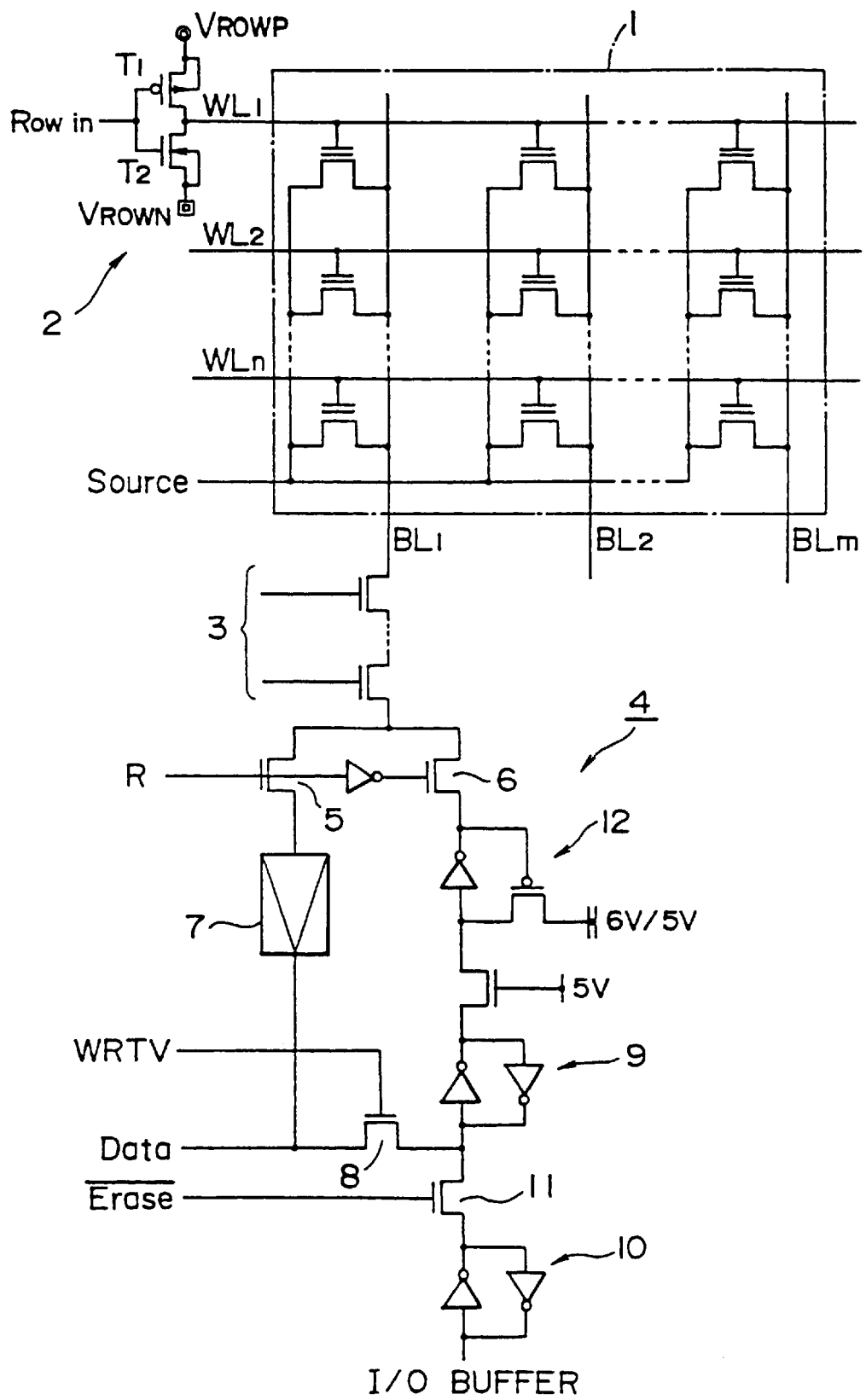
FIG. 2 is a circuit diagram of an exemplary EEPROM embodying the present invention.

FIG. 2 is a circuit diagram showing an exemplary constitution of an EEPROM according to the present invention.

In this diagram, a row decoder 2 is connected to word lines WL1–WLn of a cell array 1, and a column decoder 3 is connected to bit lines BL1–BLm.

For the purpose of driving the component elements at various voltage, the row decoder 2 consists of a C-MOS inverter which comprises inverse conduction type MOS transistors T1 and T2 connected in series to each other between a positive power source $V_{ROWP}$ for supplying, e.g., 1V, 5V and 12V, and a negative power source $V_{ROWN}$ for supplying, e.g., –5V and –10V.

In the row decoder 2, the drains of the MOS transistors T1, T2 are connected to the word line WL, and the gates thereof are connected in common to deliver a row input Row in. The row input is produced from $0V/V_{PP}$ or $0V/V_{DD}$ via a level converter (not shown) in accordance with each operation mode. The voltages applied to the word lines WL at the select and nonselect time are listed in Table 1 below.

TABLE 1

|  |  | Row in | $V_{ROWP}$ | $V_{ROWN}$ | WL |
|---|---|---|---|---|---|
| Erase | Select | 0 V | 0 V | –10 V | –10 V |
|  | Nonselect | –10 V | 0 V | –10 V | 0 V |
| Verify | Select | –5 V | 1 V | –5 V | 1 V |
| (Erase) | Nonselect | 1 V | 1 V | –5 V | –5 V |
| Write | Select | 0 V | 12 V | 0 V | 12 V |
|  | Nonselect | 12 V | 12 V | 0 V | 0 V |
| Verify | Select | –5 V | 0 V | –5 V | 0 V |
| (Write) | Nonselect | 0 V | 0 V | –5 V | –5 V |
| Read | Select | 0 V | 5 V | 0 V | 5 V |
|  | Nonselect | 5 V | 5 V | 0 V | 0 V |

Figure 1:
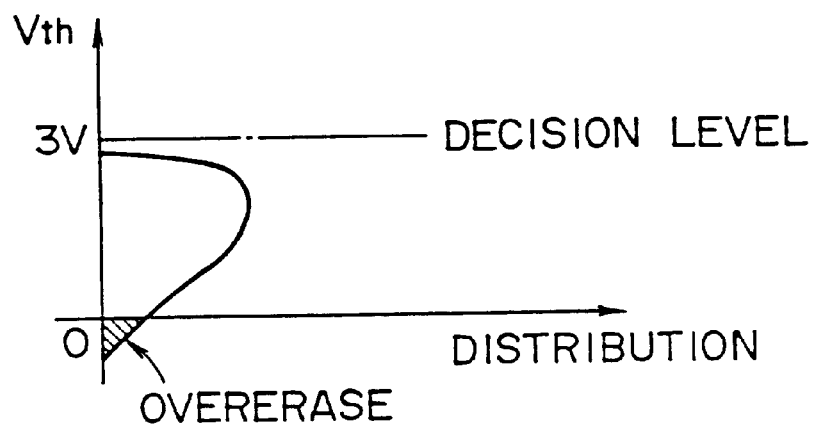
FIG. 1 graphically shows the distribution of threshold voltages of memory cells in a conventional example.
Figure 3:
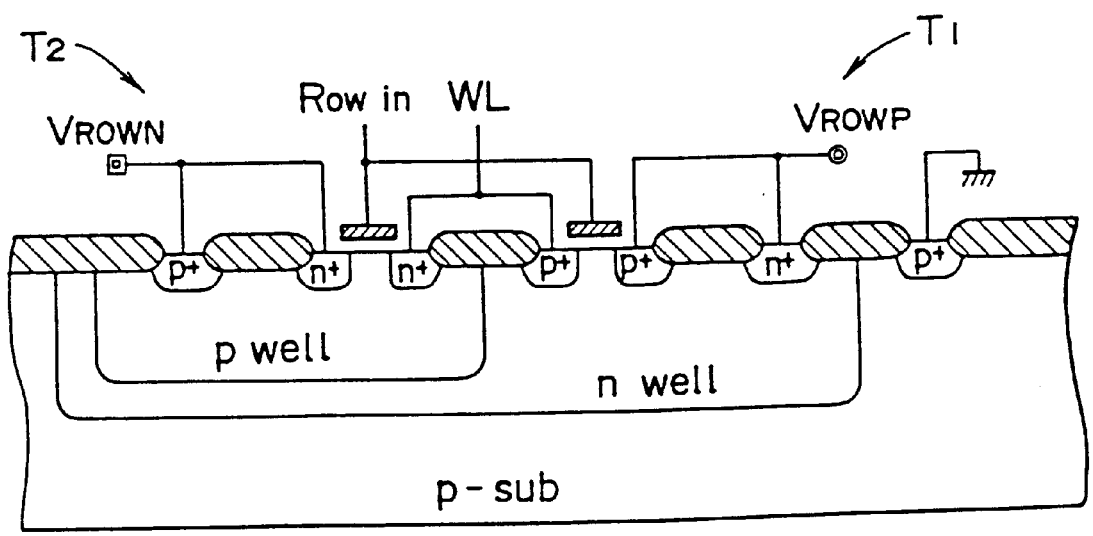
FIG. 3 is a sectional view of MOS transistors constituting a C-MOS inverter.

The MOS transistors T1, T2 constituting the C-MOS inverter are formed into a double well structure as shown in FIG. 3.

A control circuit 4 for controlling the operations of write (program), rewrite (reprogram), read, erase and verification is provided in common to m bit lines BL1–BLm.

In such control circuit 4, a MOS switch 5 is placed in an on-state during the reading and verifying operations. Meanwhile during the writing and rewriting operations, a MOS switch 6 is placed in an on-state.

The data read out via a sense amplifier 7 is outputted directly as read data in the reading mode, or is latched by a latch circuit 9 via a MOS switch 8 at the time of verification.

In the normal writing mode, data supplied from an I/O buffer (not shown) is latched by a latch circuit 10 and then is further latched by a latch circuit 9 via a MOS switch 11. And after level conversion executed in a level converter 12, the data is applied to the drain electrode of the memory cell selected by the row decoder 2 and the column decoder 3.

In the level converter 12, the supply voltage is changed to, e.g., 6V in the writing mode or to 5V in the reading mode.

Next the processing routine of the erasing method according to the present invention will be described below with reference to a flow chart of FIG. 4.

Suppose now that a pre-erase dummy writing operation has been performed to render the pre-erase threshold voltages Vth uniformed by writing "0" in the entire memory cells to be erased either collectively or per block of the cell array 1.

To begin with, an erasing cycle (A) will be described with reference to a timing chart of FIG. 5.

First, an erasing operation is performed by applying, e.g., –10V to each word line WL and, e.g., 5V to the source electrode of each cell (step S11).

Subsequently a bit line BL1 is selected while 1V is applied to the word line WL1 (steps S12 and S13). Then the threshold voltage Vth of the cell positioned at the intersection of the word line WL1 and the bit line BL1 is read out, and a decision is made as to whether the threshold voltage Vth is below a predetermined erase decision level of, e.g., 1V, that is, whether Vth≦1V or not (step S14).

At the time of such verification, a negative voltage of, e.g., −5V is applied via the word line WL2–WLn to the control gate of each nonselected cell.

When the result of the decision at step S14 signifies Vth>1 V, then the procedure returns to step S11 again to erase the entire cells collectively, and such additional erase and verification are repeated until the threshold voltage Vth of each cell is lowered below 1V.

If the result of the decision at step S14 signifies Vth≦1V, the next bit line BL2 is selected through step S15 (step S16), and then the procedure returns to step S14 to make a decision relative to the threshold voltage Vth of the bit line BL2, and such verification is repeated with regard to the entire bit lines (step S15).

Upon completion of the erase and the verification for the word line WL1, the next word line WL2 is selected through step S17 (step S18), and thereafter the procedure returns to step S13 to repeat the above processes sequentially with regard to the bit lines BL1–BLm, and the verification and the additional erase are repeated for the entire word lines until the threshold voltage Vth is lowered below 1V (step S17).

Thus, no current is caused to flow in any overerased cell due to the application of a negative voltage to the control gate of the nonselected cell at the time of verification as described, so that proper verification can be executed despite simultaneous erase of a plurality of word lines, i.e., despite the existence of any overerased cell.

In this manner, no problem arises if an over-erased condition is induced in the erasing mode, and therefore the erase decision level can be set to a lower value (approx. 1V) in comparison with the known value in the prior art, hence achieving a greater duration of the erasing pulse to be applied to the drain.

Although in this embodiment the additional erasing operation after verification is performed for the entire cells collectively on a batch erase basis, it is also possible to erase each cell group connected to the selected word line, namely, row by row.

Figure 6:
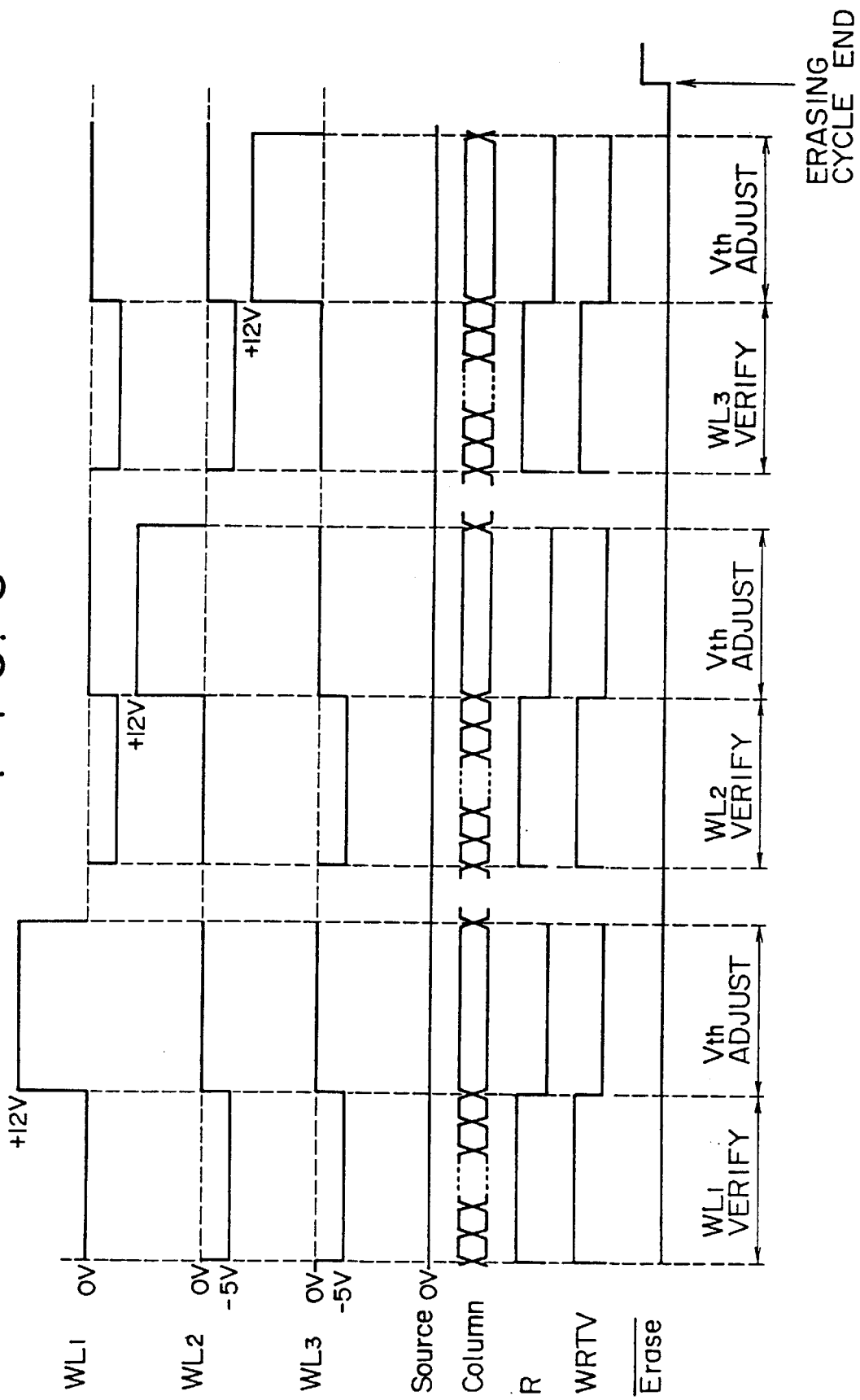
FIG. 6 is a timing chart of signals relative to a threshold voltage adjusting cycle in the invention.

Next a threshold voltage adjusting cycle (B) will be described below with reference to a timing chart of FIG. 6.

First the potential of the word line WL1 is turned to 0V, and the bit line BL1 is selected (steps S21 and S22). Then the threshold voltage Vth of the cell positioned at the intersection of the word line WL1 and the bit line BL1 is read out, and a decision is made as to whether the threshold voltage Vth is below 0V or not, i.e., whether the relevant cell is an overerased one or not (step S23). At the time of such verification, a negative voltage of, e.g., −5V is applied via the word line WL2–WLn to the control gate of any nonselected cell, so that no current is caused to flow even in the overerased cell.

If the result of the decision at step S23 signifies that the relevant cell is an overerased one, a voltage of, e.g., 12V is applied to the word line WL1 to rewrite the overerased cell (step S24). In such rewriting operation, the potential of the word lines WL2–WLn for the nonselected cells is maintained at 0V. During this operation, a write pulse of a short duration is used for minimizing the shift of the threshold voltage Vth. Although in this embodiment a voltage of 12V is applied via the word line WL to the control gate of the cell to be reprogrammed, it is also possible to apply any of adequate control gate voltages in a range of 5 to 12V.

The verification and reprogramming processes mentioned are repeated until the entire cells connected to the word line WL1 are released from the overerased state (steps S25 and S26).

Subsequently the next word line WL2 is selected (step S27). Thereafter the procedure returns to step S23 to repeat the processes sequentially with regard to the bit lines BL1–BLm, and further the verification and rewriting processes are repeated until any over-erased cells connected to the entire word lines are released from such a state (step S28).

Figure 7:
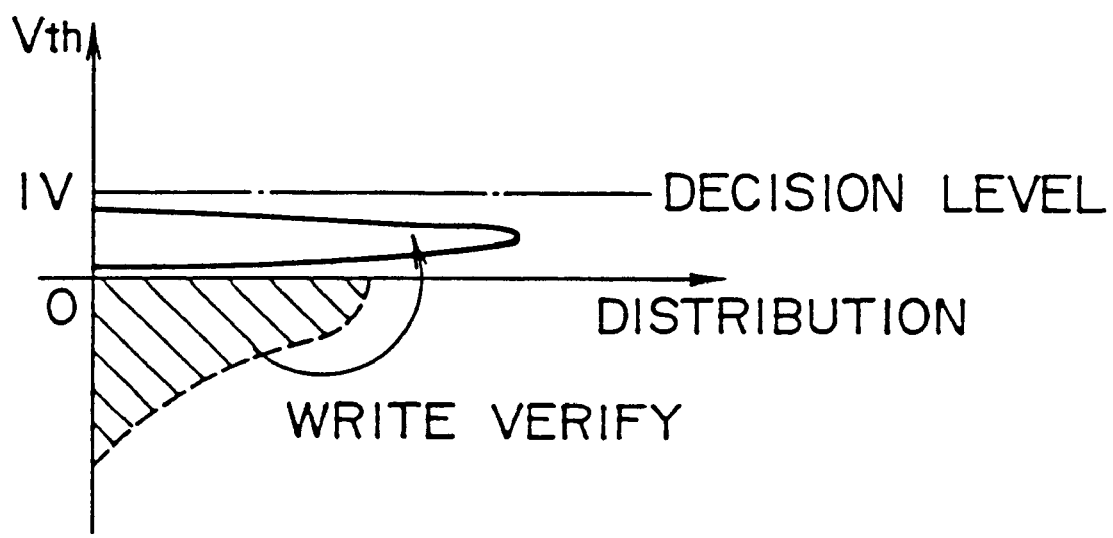
FIG. 7 graphically shows the distribution of threshold voltages of memory cells in the invention.

Thus, an erase pulse of a relatively wide duration is used and, after confirming that the threshold voltages Vth of the entire cells have been lowered below the predetermined decision level (1V in this embodiment), the overerased cells are rewritten per word line until the threshold voltage Vth is raised beyond 0V, whereby the threshold voltage distribution can be set in a considerably narrow range (0 to 1V) as graphically shown in FIG. 7, so that it becomes possible to realize a satisfactory erased state without causing any over-erase in such a manner that the threshold voltages are on the lower potential side in the post-erase threshold voltage distribution.

As the threshold voltage Vth is raised beyond 0V by rewriting, the problem of overerase is never induced in the initial state and even with any increase of the reprogramming frequency after delivery to a user. Furthermore, since the erase decision level can be set to a lower value, it is rendered possible to obtain a wide read margin to consequently achieve an advantage in attaining a faster operation, and a sufficient read margin can be ensured in a prospective lower rated supply voltage of 3V (3V/12V) which will probably be developed in the future.

Figure 4A:
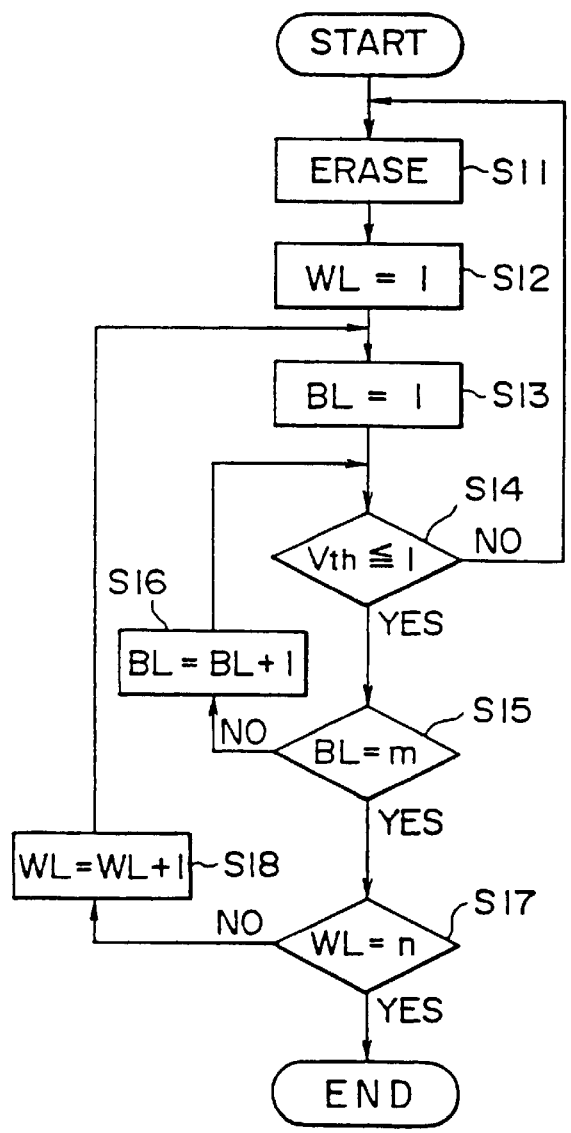
FIGS. 4A and 4B are flow charts each showing a processing routine in the erasing method of the present invention.
Figure 4B:
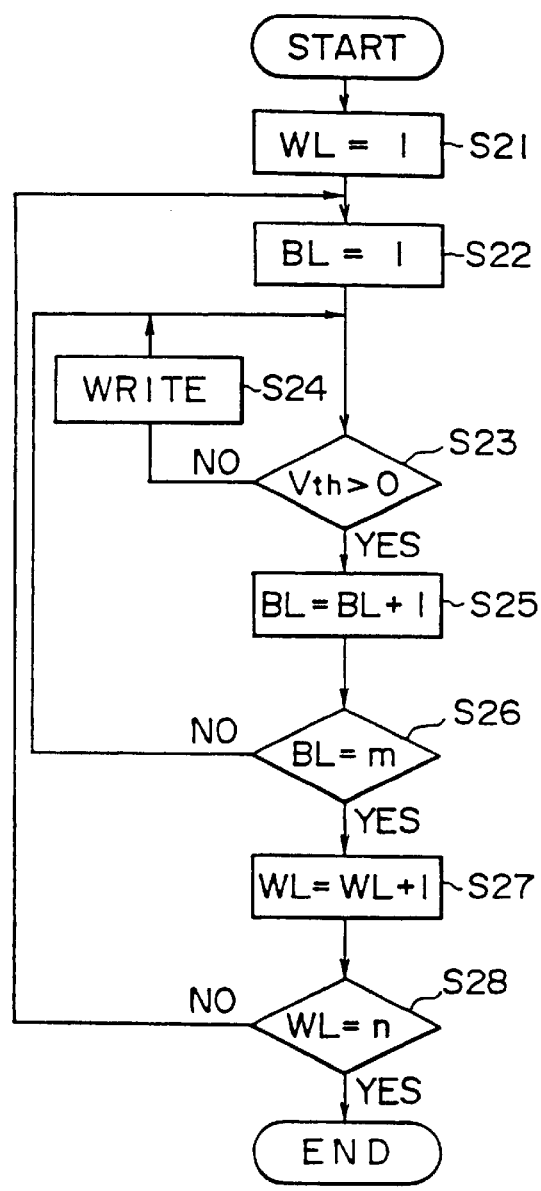

The erasing process (step S11) and the rewriting process (step S24) in the flow chart of FIG. 4 may be executed collectively for the entire memory cells of the cell array 1 or for each of divided blocks constituting the cell array 1.

Hereinafter a second embodiment of the present invention will be described in detail.

Figure 8:
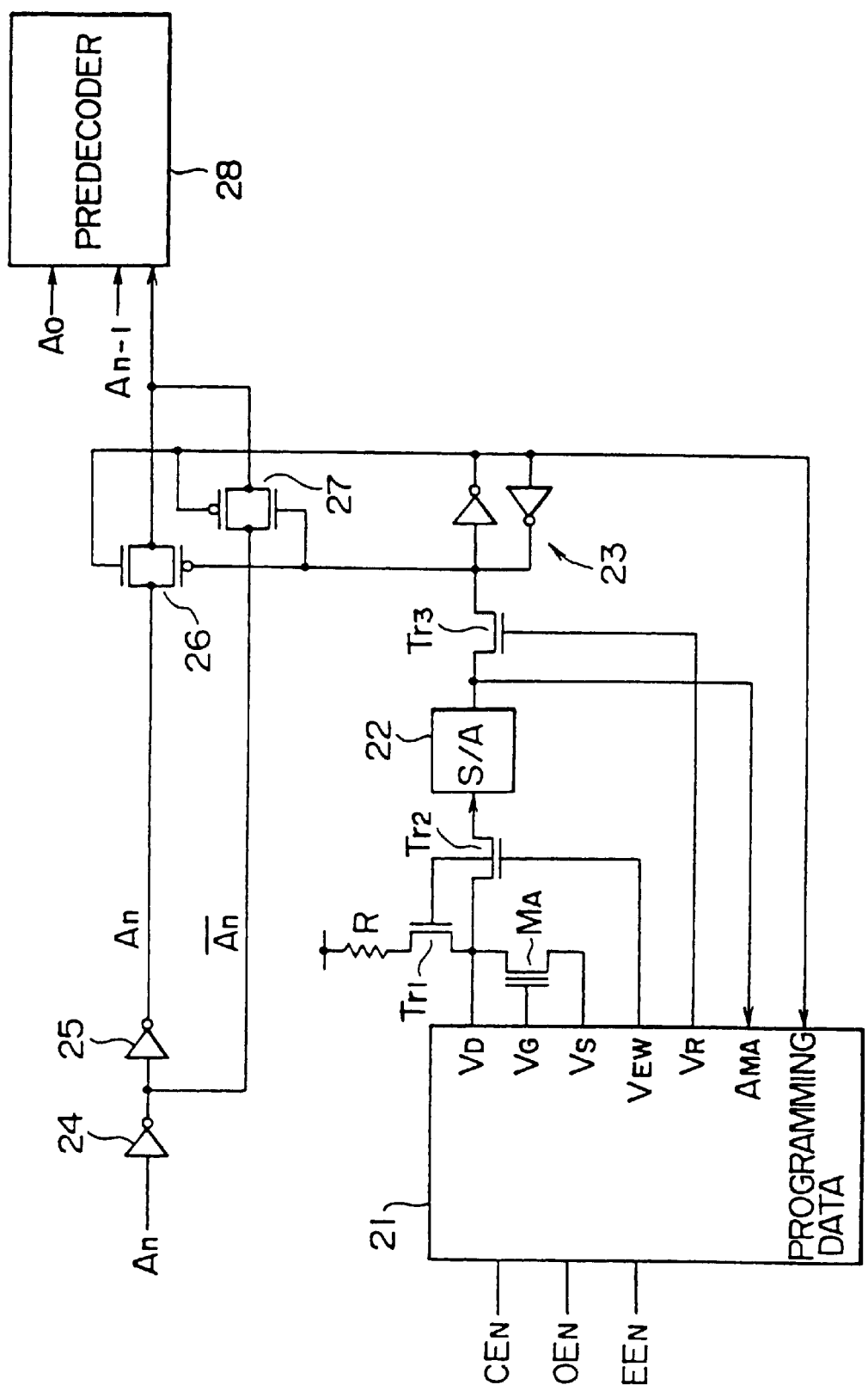
FIG. 8 is a circuit diagram of a second embodiment according to the invention.

FIG. 8 is a circuit diagram of such embodiment, wherein a timing generator 21 is employed for generating various timing signals. The timing generator 21 receives inputs of a chip enable signal $CE_N$ (where the subscript N denotes a negative logic), an output enable signal $OE_N$ and an erase enable signal $EE_N$ supplied from external circuits.

A memory area is divided into an upper block and a lower block, and an EEPROM cell $M_A$ is provided to identify each of the blocks when an address shift is executed between the two blocks.

The drain electrode of the cell $M_A$ is connected to a power supply line via a high-voltage withstand transistor Tr1 and a resistor R. And a gate voltage $V_G$, a drain voltage $V_D$ and a source voltage $V_S$ are applied from the timing generator 21 to the control gate, the drain and the source of the cell $M_A$, respectively.

The drain potential of the cell $M_A$ is inputted to a sense amplifier 22 via a high-voltage withstand transistor Tr2. And the output of the sense amplifier 22 is supplied via a transistor Tr3 to a latch circuit 23, of which latched output is the data inverse to that of the cell $M_A$ before erasing.

Out of the address signals A0–An, the MSB (most significant bit) address signal An is supplied via inverters 24, 25 and a transfer gate 26 to a predecoder 28 while being inverted in the inverter 24 and supplied via a transfer gate 27 to the predecoder 28.

Either of the transfer gates 26 and 27 is turned on in accordance with the data latched in the latch circuit 23, whereby the MSB address signal An is supplied directly, or after being inverted, to the predecoder 28.

Figure 9:
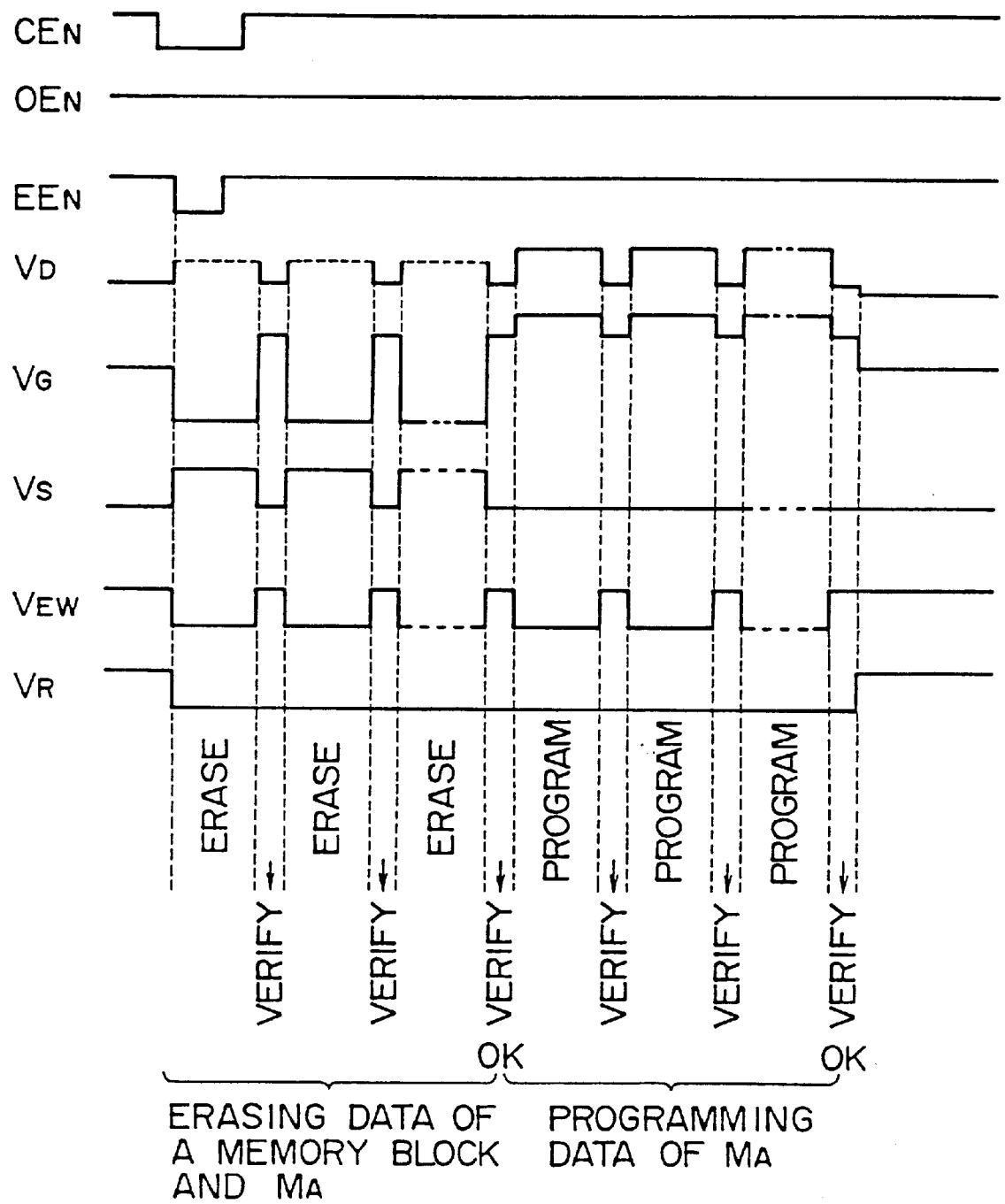
FIG. 9 is a timing chart of signals for explaining the circuit operation of the second embodiment shown in FIG. 8.

The operation of the above circuit configuration will now be described below with reference to a timing chart of FIG. 9.

When the data of the cell $M_A$ is at a low level, the output of the sense amplifier 22 and the source potential of the transistor Tr3 are also at a low level, so that the transfer gate 26 is turned on. As a result, the address signal An inputted from an external circuit is supplied as an address MSB to the predecoder 28.

Next an explanation will be given on the block erasing operation and the most significant bit inputted thereafter to the predecoder 28.

First, when the chip enable signal $CE_N$ and the erase enable signal $EE_N$ inputted from external circuits are both turned to a low level, the erasing operation is started in response thereto. In the erase mode, the data of the cell $M_A$ is also erased at the beginning or end of the memory cell address.

The transistor Tr3 is in its off-state during such erasing operation, and the data inverse to the pre-erase data of the cell $M_A$ is latched as an output of the latch circuit 23. The latched data is used also as post-erase program data for the cell $M_A$.

After completion of the erasing operation, the potential of the cell $M_A$ thus erased is at a high level. Thereafter the process proceeds to an operation of rewriting the cell $M_A$, but such process is terminated immediately since the writing data for the cell $M_A$ latched in the circuit 23 is at a high level and the potential of the cell $M_A$ is also at a high level.

Upon completion of the serial operations, the transistor Tr3 is turned on, and its source potential is changed to a high level. And the transfers gate 26 is turned off while the other transfer gate 27 is turned on, so that the inverted signal of the address signal An is supplied as an address MSB to the predecoder 28, whereby the logic address is switched.

At the time of the next block erasing operation, the output of the latch circuit 23 is at a low level, and it is used as the next writing data for the cell $M_A$.

After termination of the block erasing operation, the source potential of the transistor Tr3 is changed to a low level to turn on the transfer gate 26, whereby the address signal An is supplied directly as an address MSB to the predecoder 28.

When the data is rewritten after the block erasing operation as mentioned, the logic level of the MSB address signal An is inverted every time one block erasing operation is performed, so that the two divided upper and lower blocks are selected alternately, and a reprogramming operation is performed after designation of the data storage address on the pattern different from the one before erasing, thereby reducing the probability that the same data is written in the same address.

Consequently, it becomes possible to suppress the progress of deterioration of the tunnel oxide film derived from the repeated reprogramming relative to the film of one specific bit.

In the second embodiment mentioned above, the data storage address is switched to the upper block or the lower block of the memory area by inverting the logic level of the MSB address signal An. However, the present invention is not limited to such example alone, and there may be contrived a modification where the memory area is divided into four blocks, and the addresses An and An-1 of two high-order bits are shifted in such a manner that the data storage address is shifted block by block sequentially.

Figure 10:
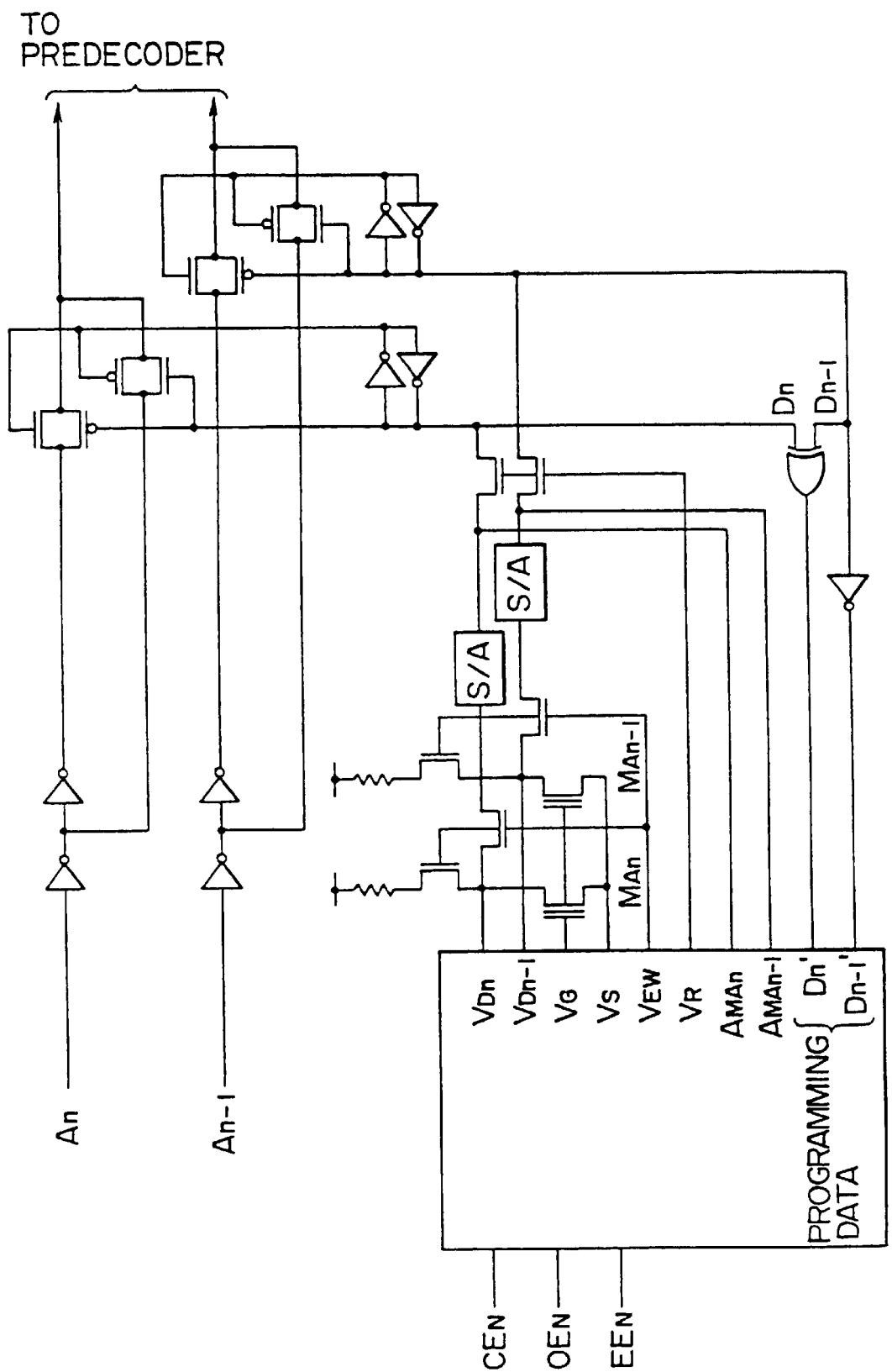
FIG. 10 is a circuit diagram of a third embodiment according to the invention.

FIG. 10 shows an exemplary circuit configuration of a third embodiment according to the present invention.

Figure 11:
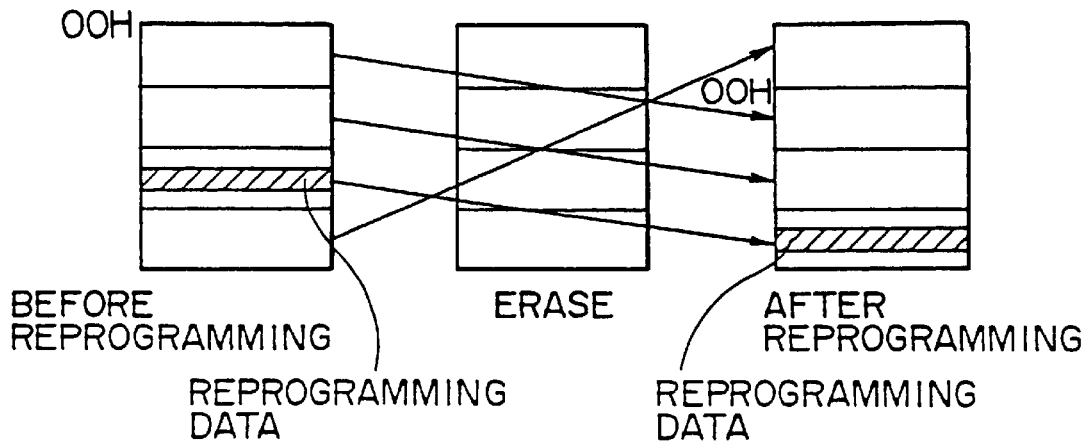
FIG. 11 is a schematic diagram for explaining the operation of the third embodiment shown in FIG. 10.

The operation of this embodiment is substantially the same as that of the aforementioned second embodiment shown in FIG. 8. The pre-erase data Dn, Dn-1 and the post-erase program data Dn', Dn-1' of two cells $M_A$n, $M_A$n-1 for identifying the four blocks have such relationship as shown in Table 2, whereby the data storage address is shifted sequentially in the four blocks as shown in FIG. 11, and is designated as a data storage address on a pattern different from the pre-erase one.

TABLE 2

| Dn | Dn − 1 | Dn' | Dn − 1' |
|---|---|---|---|
| L | L | L | H |
| L | H | H | L |
| H | L | H | H |
| H | H | L | L |

Figure 12:
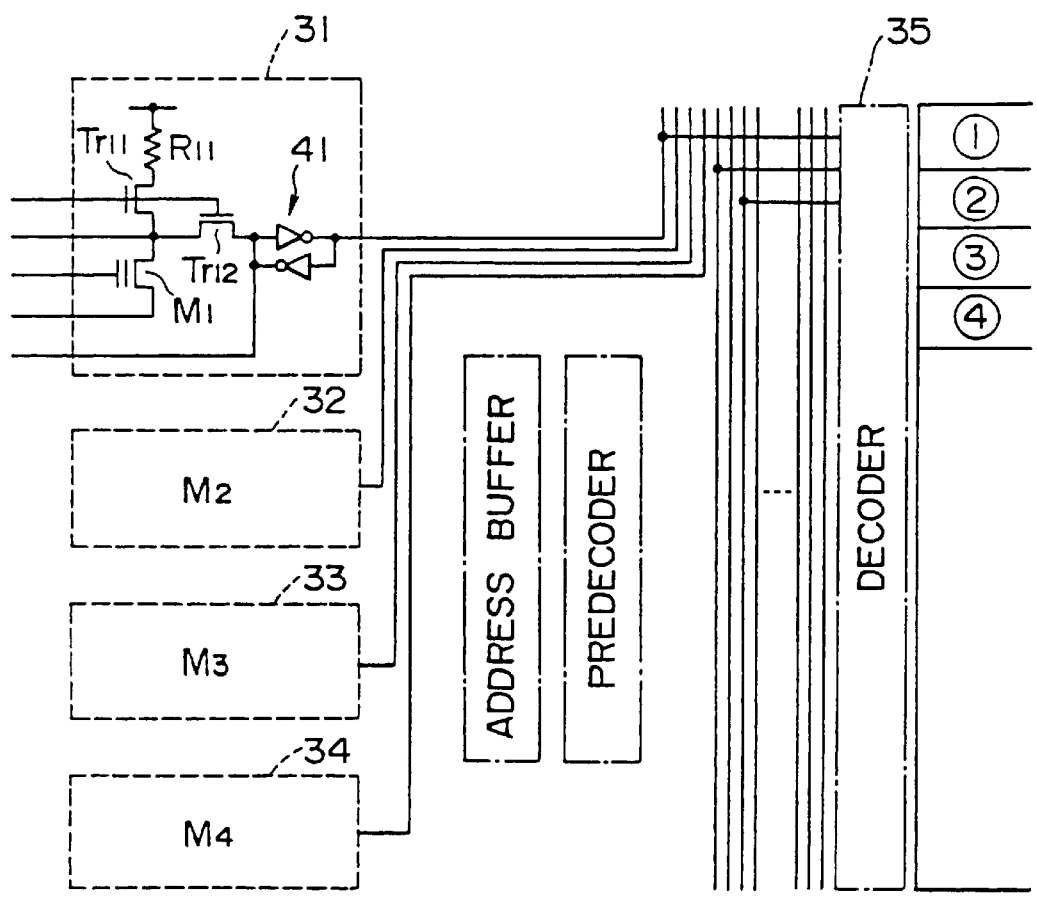
FIG. 12 is a circuit diagram of a fourth embodiment according to the invention.

FIG. 12 shows an exemplary circuit configuration of a fourth embodiment according to the present invention. This embodiment represents an application of the invention to an EEPROM having, in one memory, a block where reprogramming is executed frequently and a block where the reprogramming frequency is low.

It is assumed in this EEPROM that, with respect to the block where the reprogramming frequency is high, a memory area corresponding to several blocks is prepared for the address of one block.

Figure 13:
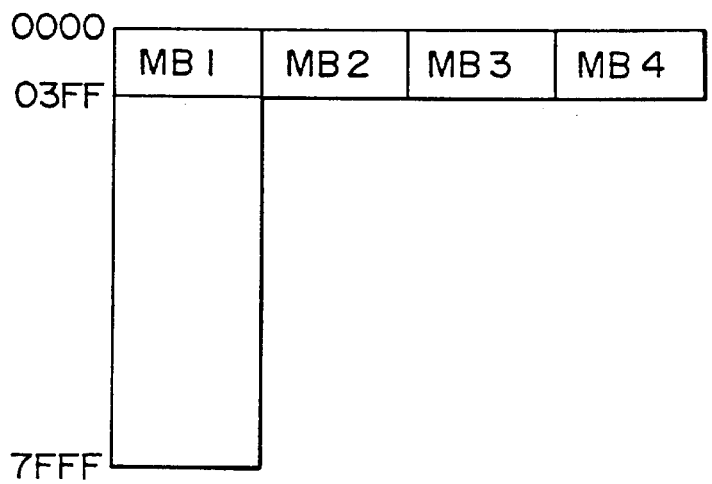
FIG. 13 shows a memory map in the fourth embodiment of the invention.

Relative to a flash EEPROM having a storage capacity of 256 Kbits, a description will be given below on an exemplary case where merely one block of 8 Kbits is frequently reprogrammed. In this example, it is assumed that, as shown in FIG. 13 four blocks MB1–MB4 are prepared for each of addresses 0000–03FF.

In FIG. 12, four physical address selectors 31–34 are provided correspondingly to the four blocks MB1–MB4 in the same address so as to select one block.

Out of such four physical address selectors 31–34 one selector 31 will now be explained as an example with regard to its specific circuit configuration.

An EEPROM cell M1 is provided for detecting whether data is written in the block MB1 for one address.

The drain electrode of the cell M1 is connected via a transistor Tr1 and a resistor R11 to a power supply line. Meanwhile a gate voltage $V_{G1}$, a drain voltage $V_{D1}$ and a source voltage $V_{S1}$ outputted from an undermentioned address switching circuit are applied respectively to the control gate, the drain and the source of the cell M1.

The drain potential of the cell M1 is latched by a latch circuit 41 via a transistor Tr12, and the output of the latch circuit 41 is supplied to a decoder 35.

A signal $Erase_N$ serves as a chip erase signal and a decode signal for addresses 0000–03FF.

Figure 14:
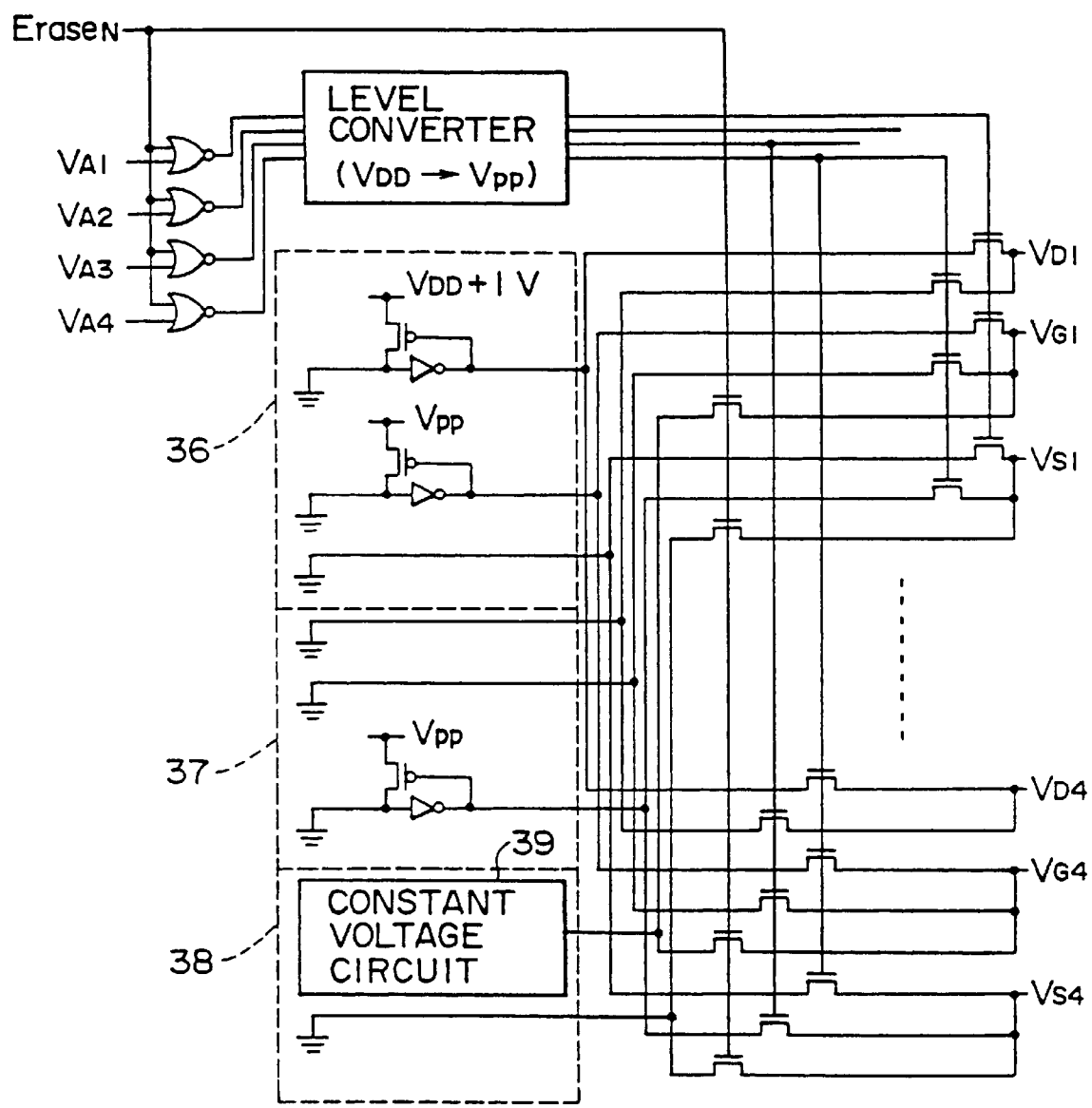
FIG. 14 is a circuit diagram of an exemplary address converter employed in the fourth embodiment of the invention.

FIG. 14 is a circuit diagram of an exemplary address converter for outputting gate voltages $V_{G1}$–$V_{G4}$, drain voltages $V_{D1}$–$V_{D4}$ and source voltages $V_{S1}$–$V_{S4}$ respectively to the four physical address selectors 31–34.

The address converter comprises an erase voltage generator 36, a write voltage generator 37 and a read voltage generator 38, and is so constituted as to supply the voltage, which conforms with each operation mode, to one of the four physical address selectors 31–34 in response to the signal Erase$_N$ or feedback signal V$_{A1}$–V$_{A4}$ obtained from the latch circuit 41.

The erase voltage generator 36 generates V$_{DD}$+1V (e.g. 6V) as a drain voltage V$_{D1}$–V$_{D4}$, V$_{PP}$ (e.g., 12 V) as a gate voltage V$_{G1}$–V$_{G4}$, and 0V as a source voltage V$_{S1}$–V$_{S4}$.

The write voltage generator 37 generates 0V as a drain voltage V$_{D1}$–V$_{D4}$ and also as a gate voltage V$_{G1}$–V$_{G4}$, and V$_{PP}$ as a source voltage V$_{S1}$–V$_{S4}$. Further the read voltage generator 38 generates a constant voltage as a gate voltage V$_{G1}$–V$_{G4}$ from a constant voltage circuit 39, and 0V as a source voltage V$_{S1}$–V$_{S4}$.

The operation of the above circuit configuration is performed as follows.

It is assumed here that, in the initial state, the cell M1 is written while the cells M2–M4 are erased. And in a memory map, as shown in FIG. 13, memory blocks are arranged with overlaps in the addresses 0000–03FF.

When any of the addresses 0000–03FF is selected in the read or write mode, the precode value outputted from the physical address selector 31–34 is also decoded in addition to the ordinary address, and one of the blocks MB1–MB4 is selected in accordance with the output value of the physical address selector 31–34. And the data is written in such selected block alone, while the other blocks are in an erased state.

Assuming now that the cell M1 alone is programmed, it signifies that the data is written merely in the block MB1.

In erasing the data, a signal for selecting the block MB1 is outputted from the physical address selector 31, whereby the block MB1 is erased. The cell M1 is also erased during such erasing operation, and then the cell M2 is programmed.

Thereafter a signal for selecting the block MB2 is outputted from the physical address selector 32, so that the block MB2 becomes an object to be written and read until the next erasing operation is performed.

Figure 15A:
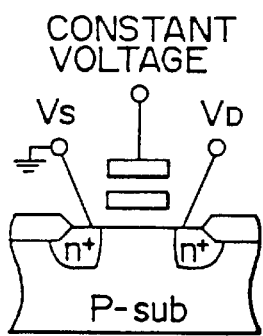
FIG. 15 illustrates how voltages are applied to memory cells M1–M4 during the operations in a reading mode (A), an erasing mode (B) and a programming mode (C) in the fourth embodiment of the invention.
Figure 15B:
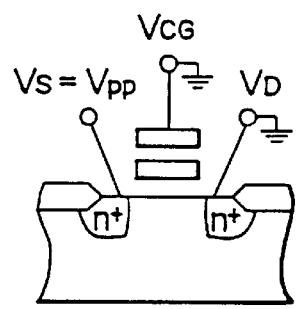
Figure 15C:
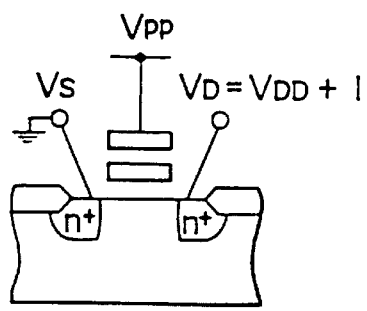

FIG. 15 shows the voltages applied to the cells M1–M4 in individual states.

In the reading mode (A), a constant voltage is applied as a control gate voltage V$_{CG}$ to the cells M1–M4, and 0V is applied as a source voltage V$_S$.

In the erasing mode (B), a cell to be erased by the feedback circuits V$_{A1}$–V$_{A4}$ (written cell out of M1–M4) and a cell to be programmed are selected, and the signals are suplied thereto.

And in the programming mode (C), V$_{PP}$ is applied as a control gate voltage V$_{CG}$ to the cells M1–M4, and V$_{DD}$+1V is applied as a drain voltage V$_D$.

In this manner, the block to be accessed is changed in every erasing operation sequentially as MB1→MB2→MB3→MB4→MB1 so that, with regard to the operation of reprogramming the data in the blocks of the areas 0000–03FF, four reprogramming operations apparently correspond to one operation in any other block.

In this memory, the number of repeatable reprogramming operations in the areas 0000–03FF is defined as that of the chip. Thus, according to this embodiment, there is realized an improved EEPROM where the number of repeatable reprogramming actions can be increased apparently four times.

Consequently, when the present invention is used in any device where the data reprogramming frequency is high in a specific area alone, as in an SD where the file allocation table (FAT) is reprogrammed every time the data is reprogrammed, the number of repeatable reprogramming actions can be increased apparently to eventually attain remarkable enhancement.

What is claimed is:

1. A flash EEPROM comprising:
    a plurality of blocks and an address converter for converting an external designated address to an internal chip address, and wherein the address converter varies a selected one of said plurality of blocks by altering said internal chip address corresponding to a specific external designated address wherein said address converter executes address conversion by altering a most significant bit (MSB) of the internal chip address.

2. A flash EEPROM comprising: at least one spare storage area and a specific storage area;
    an address converter for converting an external designated address to an internal chip address and wherein said internal chip address corresponding to said external designated address is altered between at least a first and second internal address so that a correspondence of the external designated address is changed between the specific storage area and said spare storage area wherein said address converter executes address conversion by altering a most significant bit (MSB) of the internal chip address signal.

3. A method for storing information comprising the steps of:
    correlating an external memory address with a first internal memory location; and
    correlating the external memory address with second internal memory location wherein the step of correlating the external memory address with a second internal memory location comprises a step of converting at least an MSB of an internal address signal.

* * * * *